US008253458B2

(12) United States Patent
Sinha et al.

(10) Patent No.: US 8,253,458 B2
(45) Date of Patent: Aug. 28, 2012

(54) DIGITAL PHASE LOCKED LOOP WITH REDUCED SWITCHING NOISE

(75) Inventors: Anand K. Sinha, Noida (IN); Sanjay K. Wadhwa, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 127 days.

(21) Appl. No.: 13/004,043

(22) Filed: Jan. 11, 2011

(65) Prior Publication Data

US 2012/0176169 A1  Jul. 12, 2012

(51) Int. Cl.
 *H03L 7/06* (2006.01)
(52) U.S. Cl. ........................................ 327/156; 327/147
(58) Field of Classification Search .................. 327/147, 327/156
See application file for complete search history.

(56) References Cited

U.S. PATENT DOCUMENTS

| | | | |
|---|---|---|---|
| 5,687,201 A | 11/1997 | McClellan | |
| 5,874,863 A | 2/1999 | Wojewoda | |
| 6,407,600 B1 | 6/2002 | Lu | |
| 6,919,769 B2 | 7/2005 | Lim | |
| 6,922,047 B2 | 7/2005 | Knoll | |
| 7,078,977 B2 | 7/2006 | Maneatis | |
| 7,095,287 B2 | 8/2006 | Maxim | |
| 7,135,934 B2 | 11/2006 | Sanchez | |
| 7,365,581 B2 | 4/2008 | Shi et al. | |
| 7,391,271 B2 | 6/2008 | Cranford, Jr. et al. | |
| 7,466,174 B2 | 12/2008 | Tirumalai | |
| 7,515,003 B2 | 4/2009 | Park | |
| 7,809,345 B2 | 10/2010 | May | |
| 7,999,586 B2 * | 8/2011 | Lee et al. | 327/159 |
| 8,076,960 B2 * | 12/2011 | Geng et al. | 327/156 |
| 8,207,767 B2 * | 6/2012 | Endo et al. | 327/156 |
| 2008/0218229 A1 | 9/2008 | Cranford et al. | |
| 2008/0265958 A1 | 10/2008 | Beaulaton | |
| 2010/0164569 A1 | 7/2010 | Bode | |
| 2010/0271137 A1 | 10/2010 | Kythakyapuzha | |
| 2010/0271138 A1 | 10/2010 | Thakur | |

OTHER PUBLICATIONS

J. Maneatis, Low-Jitter Process-Independent DLL and PLL based on self-biased techniques, IEEE Journal of Solid State Circuits, vol. 31, pp. 1723-1732, Nov. 1996.
Stefanos Sidiropoulos et al., Adaptive Bandwidth DLLs and PLLs using Regulated Supply CMOS Buffers, 2000.
Yu-Jen Lai et al., an Agile VCO Frequency Calibration Technique for a 10-GHz CMOS PLL, IEEE Journal of Solid State Circuits vol. 42, No. 2, Feb. 2007.

* cited by examiner

*Primary Examiner* — Hai L Nguyen
(74) *Attorney, Agent, or Firm* — Charles Bergere

(57) ABSTRACT

A method to operate a digital phase locked loop (DPLL) in which the DPLL includes a phase-frequency detector that compares the frequency of a reference signal with a feedback signal to generate an error signal. The error signal is used to generate first and second control words. Binary current control word bits and thermometric current control word bits are generated using the first and second control words, respectively. A binary controller switches a first set of binary current sources prior to a frequency lock being achieved using the binary current control word bits and the thermometric current control word bits are held at a predetermined value. After achieving the frequency lock, the binary current sources are fixed and then a thermometric controller switches a second set of thermometric current sources using the thermometric current control word bits. Operating the DPLL using the binary controller before the frequency lock and the thermometric controller after the frequency lock reduces switching noise and achieves stable loop dynamics.

20 Claims, 3 Drawing Sheets

DIGITAL PHASE LOCKED LOOP WITH REDUCED SWITCHING NOISE

BACKGROUND OF THE INVENTION

The present invention relates to a digital phase locked loop, and, more particularly, to a method for reducing switching noise in a digital phase locked loop.

Recent years have seen advancements in the field of electronic circuits and communication systems. Phase locked loops (PLLs) are an integral part of these systems. A PLL is used to generate an oscillating signal based on a reference signal. In communication systems, the oscillating signal is used for modulation and demodulation of a message signal and in electronic circuits the oscillating signal is used as a clock signal for synchronous operation of the circuit. Conventional PLLs were analog in nature and had various limitations such as bulky size due to their capacitor and resistor circuits. In newer technologies, the oxide thickness of the underlying semiconductor has been decreasing, and this has been problematic for a large area capacitor based analog loop filter because the gate leakage increases exponentially with oxide thickness reduction, and non-negligible gate leakage causes a large reference spur, which increases jitter in the output clock.

To overcome the above-stated limitations, a digital phase locked loop (DPLL) has been developed. FIG. 1 shows an example of a conventional DPLL 100. The DPLL 100 includes a phase-frequency detector (PFD) 102, a time to digital converter (TDC) 104, a digital filter 106, a digital to analog converter (DAC) 108, a current controlled oscillator (CCO) 110 and a divider 112.

The PFD 102 receives a reference signal generated by an external source and a feedback signal. The PFD 102 and compares the phase and frequency of these signals to generate an error signal whose magnitude depends on the phase and frequency difference between the reference signal and the feedback signal. The error signal is converted to a digital signal by the TDC 104. The digital error signal is transmitted to the digital filter 106, which attenuates high frequency noise components in the error signal and generates a control word signal based on the error signal. The control word from the digital filter 106 is transmitted to the DAC 108, which converts the control word to an analog control signal. The DAC 108 has one or more binary weighted current sources (not shown). The DAC 108 switches these current sources to a conducting state or a non-conducting state based on the control word to generate a current signal. The current signal is transmitted to the CCO 110, which generates the output signal based on the current signal. The output signal is transmitted to the divider 112, which reduces the frequency of the output signal by a predefined factor to generate the feedback signal.

The control word generated by the digital filter 106 switches the current sources of the DAC 108. For example, when the output signal has achieved a frequency/phase lock, which is a condition in which the frequency and phase of the reference signal are equal to the frequency and phase of the feedback signal, the value of the control word may be '01111', which will cause four of the DAC current sources to a conducting state. If, in order to maintain the frequency/phase lock the control word has to be increased by 1 (e.g., incremented), the control word will change to '10000', then four of the DAC current sources will switch to a non-conducting state and one current source will switch to a conducting state. Since the current sources are binary weighted, the instantaneous change in the magnitude of the current signal, due to the switching of the current sources, is large, which leads to generation of a current surge. This current surge is transmitted to the CCO 110, which results in high frequency jitter in the output signal. It would be advantageous to have a DPLL with reduced switching noise caused by current surges generated by switching of the DAC current sources.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
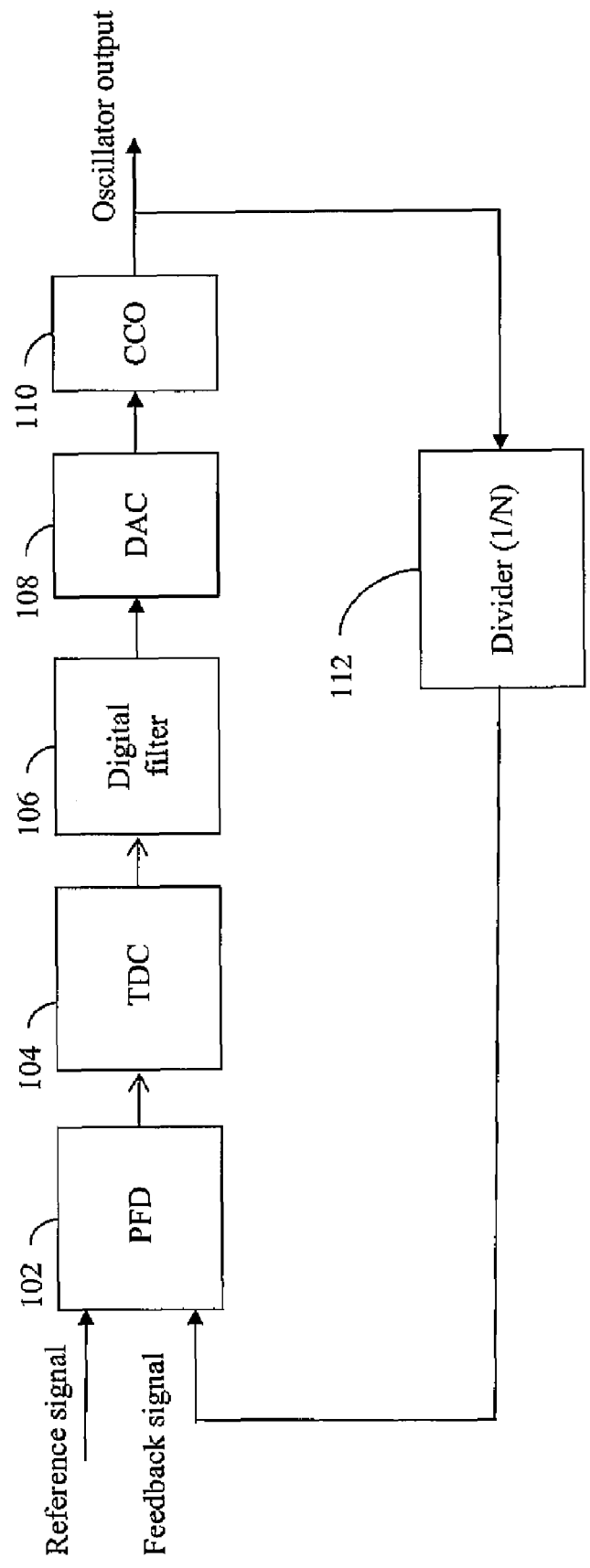
FIG. 1 is a schematic diagram of a conventional digital phase locked loop (DPLL)

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a method of operating a digital phase locked loop (DPLL) is provided. In the DPLL, an output signal is generated by a current controlled oscillator (CCO). The frequency of the output signal is dependent on the magnitude of current signal provided by first and second sets of current sources. The frequency of the output signal is reduced by a predetermined factor to generate a feedback signal. The phase and frequency of the feedback signal are compared with the phase and frequency of the reference signal to generate an error signal. First and second control words are generated using the error signal. Binary current control word bits and thermometric current control word bits are generated by respective binary and thermometric controllers using the first and second control words. The DPLL is operated by the binary controller before a frequency lock is achieved. That is, the binary current control word bits control the switching of the first set of current sources. While the first set of current sources is being switched, the thermometric current control word bits are held at a fixed value. After the frequency lock has been achieved, the DPLL is operated by the thermometric controller, where the thermometric current control word bits are used to control switching of the second set of current sources. When the second set of current sources is being switched, the binary current control word bits are held at a fixed value that corresponds to the value of the binary current control word bits when the frequency lock was achieved.

In another embodiment of the present invention, a DPLL is provided. The DPLL includes a CCO connected to a first set of current sources, a second set of current sources and a loop divider. The CCO generates an output signal based on a magnitude of the current signals generated by the first and second sets of current sources. The loop divider reduces the frequency of the output signal by a predetermined factor to generate a feedback signal. A phase-frequency detector (PFD), connected to the loop divider, compares the phase and frequency of the feedback signal with the phase and frequency of a reference signal to generate an error signal. A time-to-digital-converter (TDC), connected to the PFD, converts the error signal to a digital signal. A digital filter receives the digital error signal and generates first and second control words based on the error signal. A binary controller receives the first control word and generates binary current control word bits, while the second control word is thermometrically coded by a binary to thermometric converter. A thermometric controller, connected to the binary to thermometric converter, generates thermometric current control word bits. Before a frequency lock is achieved, the binary controller is used to operate the DPLL. That is, the binary current control word bits are used to switch the first set of current sources while the thermometric current control word bits are held at a predetermined value. After the frequency lock has been achieved, the binary current control word bits are fixed at the value corresponding to the frequency lock condition and the thermometric controller operates the DPLL. That is, the thermometric current control word bits are used to control the switching of the second set of current sources.

Holding the thermometric current control word bits at a fixed value prior to the frequency lock and holding the binary current control word bits at a fixed value after the frequency lock leads to a stable operation of the DPLL. The second set of current sources is thermometrically weighted. In one embodiment of the invention, the unit current (minimum current) value of both the first and second sets of current sources is equal, resulting in stable control loop dynamics. A unit change in current value generated by the first and second sets current sources could require changing the states of current sources differently. For example, a unit change in the second set of current sources (thermometrically weighted) requires changing the state of one current source only, however, the same may require changing many current source states in the case of the first set of current sources (binary weighted). Thus, current surges generated due to the switching of the current sources are reduced as compared to the conventional DPLL system.

Figure 2:
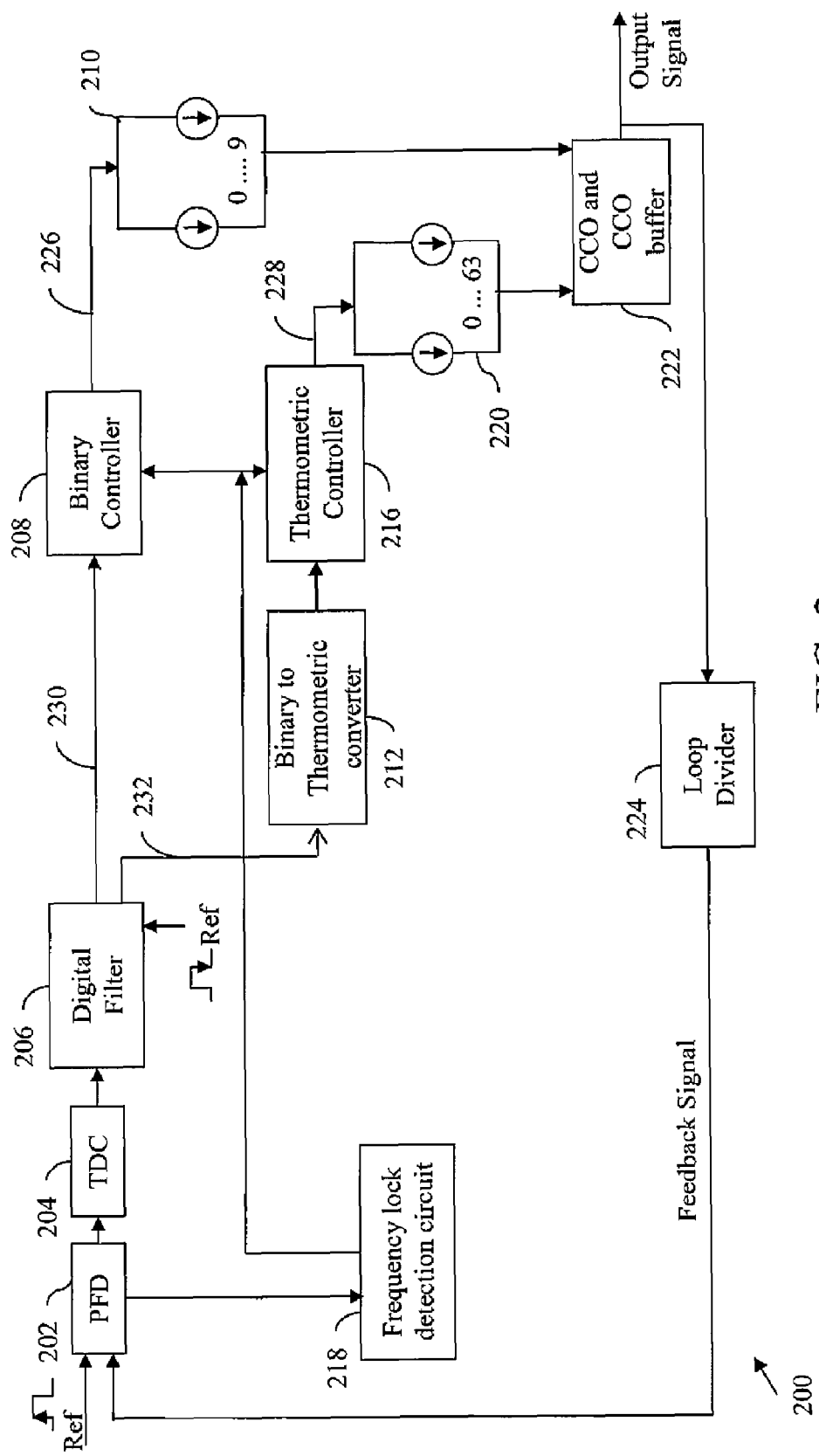
FIG. 2 is a schematic diagram of a DPLL in accordance with an embodiment of the present invention.

Referring now to FIG. 2, a schematic diagram of a DPLL 200 in accordance to an embodiment of the present invention is shown. The DPLL 200 includes a phase-frequency detector (PFD) 202, a time-to-digital-converter (TDC) 204, a digital filter 206, a binary controller 208, a first set of current sources 210, a binary to thermometric converter 212, a thermometric controller 216, a frequency lock detector 218, a second set of current sources 220, a current controlled oscillator (CCO) 222, and a loop divider 224.

As shown in FIG. 2, the PFD 202 is connected to the TDC 204. The TDC 204 is connected to the digital filter 206. Further, the digital filter 206 is connected to the binary controller 208 and the binary to thermometric converter 212. The binary controller 208 is connected to the first set of current sources 210, which in one embodiment of the invention are binary weighted. The binary to thermometric converter 212 is connected to the thermometric controller 216, and the thermometric controller 216 is connected to the second set of current sources 220. In one embodiment of the present invention, the second set of current sources 220 is thermometrically coded. The first and second sets of current sources 210 and 220 are connected to the CCO 222. The CCO 222 is connected to the loop divider 224, and the loop divider 224 is connected to the PFD 202. The frequency lock detector 218 is connected between the PFD 202 and the binary and thermometric controllers 208 and 216.

In operation, the CCO 222 generates an output signal based on the current signals from the first and second sets of current sources 210 and 220. In an embodiment of the present invention, the output signal is an oscillating signal. The output signal from the CCO 222 is transmitted to the loop divider 224. The loop divider 224 reduces the frequency of the output signal by a predefined factor to generate a feedback signal. In an embodiment of the present invention, the predefined factor is an integer value. The feedback signal is transmitted to the PFD 202. The PFD 202 compares the frequency and phase of a reference signal with the frequency and phase of the feedback signal to generate an error signal, which is transmitted to the TDC 204. The TDC 204 samples the error signal and converts the error signal to a digital signal, which is provided to the digital filter 206. The digital filter 206 generates a first control word 230 and a second control word 232 based on the digitized error signal. In one embodiment of the present invention, the second control word 232 includes one or more least significant bits (LSBs) of the first control word 230. The digital filter 206 also attenuates the high frequency noise generated during the conversion of the error signal from an analog signal to a digital signal by the TDC 204.

The binary controller 208 converts the first control word 230 to binary current control word bits 226 while the second control word 232 is thermometrically coded by the binary to thermometric converter 212. The thermometric controller 216 then generates thermometric current control word bits 228 based on the second control word 232.

The binary controller 208 is used to operate the DPLL 200 prior to a frequency lock condition being achieved. Frequency lock represents a condition in which the frequency of the feedback signal is equal to the frequency of the reference signal. The frequency lock detection circuit 218 is used to detect the frequency lock condition. The binary controller 208 controls the switching of the first set of current sources 210 using the binary current control word bits 226. At this time (before frequency lock), the thermometric current control word bits 228 are held at a predetermined fixed value so that the second set of current sources are not being switched. The second set of current sources 220 generate a current signal based on the thermometric current control word bits 228. As the thermometric current control word bits 228 are held at a predetermined value, the magnitude of current signal from the second set of current 220 sources is constant.

The first set of current sources 210 are switched using the binary current control word bits 226 generated by the binary controller 208. In a preferred embodiment of the present invention, the first set of current sources 210 are binary weighted. The current signals generated by the first and second sets of current sources 210 and 220 are transmitted to the CCO 222, which generates the output signal based on the current signals. The first set of current sources 210, which is binary weighted, enables production of a high value current signal. Thus, the first set of current sources 210 enables the CCO 222 to generate an output signal that can attain the frequency lock condition quickly. Once the frequency lock condition is attained, and detected by the frequency lock detection circuit 218, a frequency lock signal is asserted to shift the DPLL 200 from operating using the binary controller 208 and the first set of current sources to the thermometric controller 216 and the second set of current sources 220. In an embodiment of the present invention, the frequency lock signal is generated when the frequency and phase of the feedback signal just leads the frequency and phase of the reference signal.

After the frequency lock, the binary current control word bits 226 are fixed or held at a value that corresponds to the frequency lock condition (i.e., that value of the bits 228 when the frequency lock condition was detected). Thereafter, the thermometric current control word bits 228, generated by the thermometric controller 216, are varied for the purpose of phase acquisition of the output signal. The thermometric controller 216 switches the second set of current sources 220 using the thermometric current control word bits 228. As previously discussed, the second set of current sources 220 preferably is thermometrically weighted. The current signals from the first and second set of current sources 210 and 220 are transmitted to the CCO 222 and the CCO 222 generates the output signal based on the current signals. A unit current (minimum current) value of both the first and second sets of current sources is equal, resulting in stable control loop dynamics. A unit change in current value generated by first and second sets current sources could require changing the states of current sources differently. For example, a unit change in the second set of current sources (thermometrically weighted) requires changing the state of one current source only, whereas a unit change in a binary weighted control word may require changing many current source states. Thus, the current surge that is generated due to the switching of the current sources in the present DPLL system is reduced because the binary weighted current sources are fixed once the frequency lock is attained and only the thermometrically current sources are switched thereafter.

Figure 3:
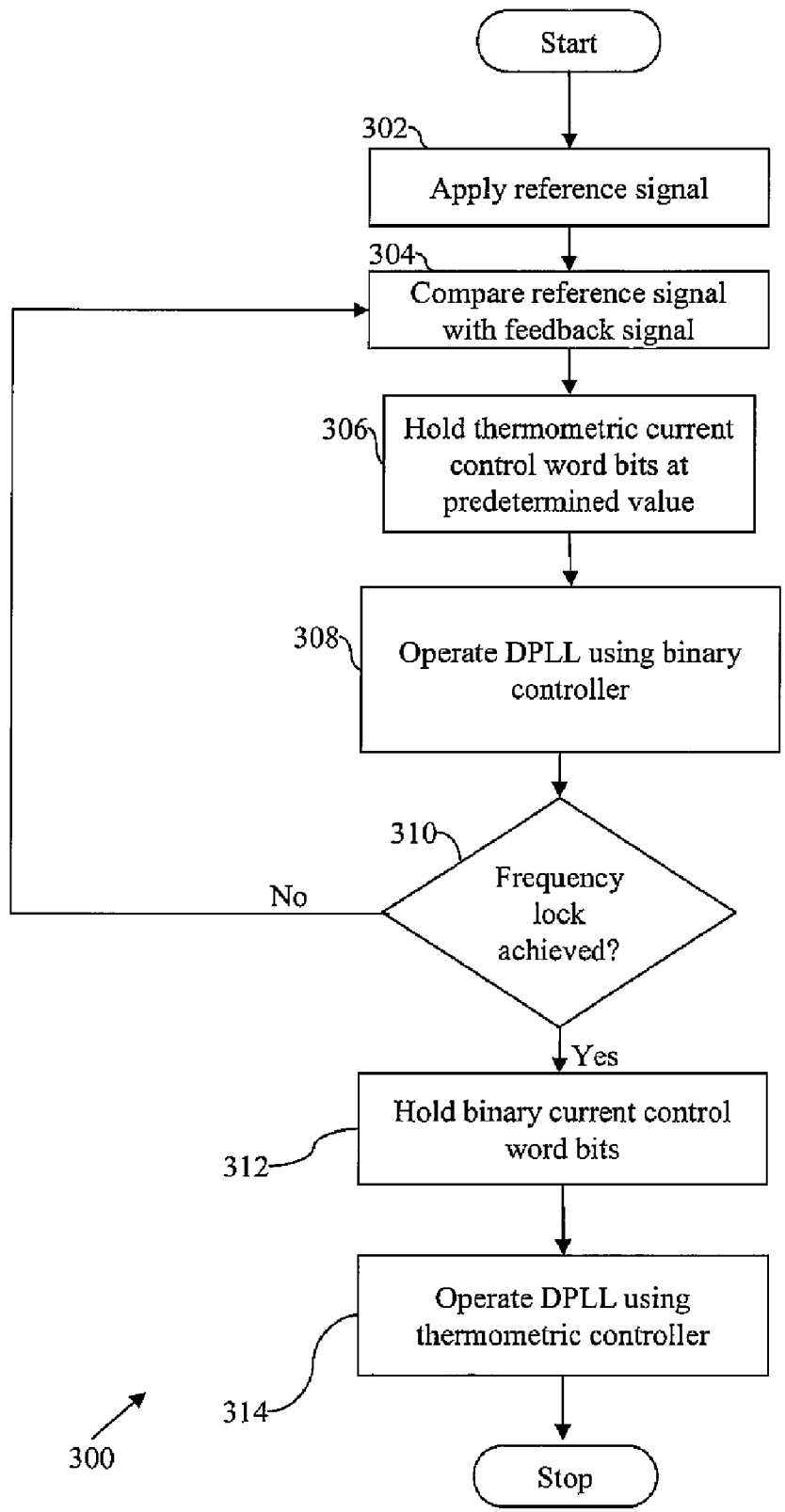
FIG. 3 is a flowchart illustrating a method to operate the DPLL of FIG. 2 in accordance with an embodiment of the present invention.

FIG. 3 is a flowchart illustrating a method of operation of a DPLL in accordance to an embodiment of present invention. At step 302, a reference signal generated by an external source is provided to the PFD 202. In an embodiment of the present invention the reference signal is an oscillating signal. At step 304, the PFD 202 compares the reference signal with a feedback signal. The feedback signal is generated by reducing the frequency of the output signal generated by the CCO 222 by a predetermined factor. More particularly, the PFD 202 compares the frequency and the phase of the reference signal with those of the feedback signal and generates an error signal based on the comparison. The error signal is converted to a digital signal by the TDC 204 and the digitized error signal is used to generate first and second control words 230 and 232. Thereafter, binary current control word bits 226 and thermometric current control word bits 228 are generated based on the first and second control words 230 and 232.

At step 306, the thermometric current control word bits 228 are held at the value as initially generated by the binary to thermometric converter 212. In an alternative embodiment, the thermometric current control word bits 228 are held at a predetermined value until after a frequency lock is detected and then the control word bits 228 are permitted to vary. At step 308, the binary controller 208 is used to operate the DPLL 200. The binary controller 208 controls the switching of the first set of current sources 210 using the binary current control word bits 226. The second set of current sources 220 generate current signal based on the thermometric current control word bits 228. As the thermometric current control word bits 228 are fixed at a predetermined value, thus, the magnitude of current signal from the second set of current 220 sources is constant. Further, the first set of current sources 210 are switched based on the binary current control word bits 226 generated by the binary controller 208. The first set of current sources 210 are binary weighted. Thereafter, the current signals generated due to the first set of current sources 210 and second set of current sources 220 are transmitted to the CCO 222. The CCO 222 generates an output signal based on the current signals. At step 310, a check is performed whether a frequency lock has been achieved. The frequency lock represents a condition that the frequency of the reference signal is equal to the frequency of the feedback signal. At step 310, if it is determined that the frequency lock has not been achieved, then the above mentioned steps (steps 304 to 310) are repeated. At step 310, if it is determined that the frequency lock has been achieved, then at step 312 the binary current control word bits are fixed at a value that corresponds to the frequency lock condition. At step 314, the thermometric current control word bits are varied for the purpose of phase acquisition and maintenance of the output signal at a predetermined value. The thermometric controller 216 switches the second set of current sources 220 using thermometric current control word bits 228. The second set of current sources 220 is thermometrically weighted. Further, the current signals from the first and second set of current sources 210 and 220 are transmitted to the CCO 222. The CCO 222 generates an output signal based on the current signals.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What claimed is:

1. A method for operating a digital phase locked loop (DPLL), the DPLL including a binary controller, a thermometric controller, a current controlled oscillator (CCO), and first and second sets of current sources, the method comprising:

generating an output signal by the CCO based on a magnitude of a current signal provided by the first and the second sets of current sources;

reducing a frequency of the output signal by a predetermined factor to generate a feedback signal;

comparing the frequency and phase of an externally generated reference signal with the feedback signal to generate an error signal;

generating first and second control words using the error signal, wherein the first and second control words have at least one bit;

generating binary current control word bits and thermometric current control word bits based on the first and second control words respectively;

controlling switching of the first set of current sources prior to a frequency lock using the binary current control word bits, wherein the thermometric current control word bits are fixed at a predetermined value, wherein the frequency lock represents a condition in which the frequency of the reference signal is equal to the frequency of the feedback signal; and controlling switching of the second set of current sources subsequent to the frequency lock based on the thermometric current control word bits, wherein the binary current control word bits are fixed when the frequency lock is achieved.

2. The method for operating a DPLL of claim 1, further comprising converting the error signal to a digital signal prior to generating the first and second control words.

3. The method for operating a DPLL of claim 1, wherein the second control word is thermometrically coded prior to the switching of the second set of current sources by the thermometric controller.

4. The method for operating a DPLL of claim 1, wherein current sources of the first set of current sources are binary weighted.

5. The method for operating a DPLL of claim 1, wherein the magnitude of the current signals generated by the current sources of the second set of current sources are identical.

6. The method for operating a DPLL of claim 1, wherein the binary controller and the thermometric controller are digital to analog current sources.

7. The method for operating a DPLL of claim 1, further comprising detecting the frequency lock with a frequency lock detector.

8. The method for operating a DPLL of claim 1, wherein the output signal generated by the CCO is an oscillating signal.

9. A digital phase locked loop (DPLL) that receives a reference signal generated by an external source and generates an output signal, the DPLL comprising:
   a current controlled oscillator (CCO), connected to first and second sets of current sources, that generates the output signal based on a magnitude of currents generated by the first and second sets of current sources;
   a loop divider, connected to the CCO, that receives the output signal and reduces a frequency thereof by a predetermined factor to generate a feedback signal;
   a phase-frequency detector (PFD), connected to the loop divider, that receives and compares the reference signal and the feedback signal and generates an error signal;
   a time-to-digital converter (TDC), connected to the PFD, that converts the error signal to a digital error signal;
   a digital filter, connected to the TDC, that generates first and second control words based on the digital error signal, wherein the first and second control words have at least one bit;
   a binary to thermometric converter, connected to the digital filter, that thermometrically codes the second control word;
   a binary controller, connected to the digital filter and the first set of current sources, for generating binary current control word bits based on the first control word, wherein the binary current control word bits are used to control switching of the first set of current sources before a frequency lock has been achieved, wherein the frequency lock represents a condition in which the frequency of the reference signal is equal to the frequency of the feedback signal; and
   a thermometric controller, connected to the second set of current sources and the binary to thermometric converter, for generating thermometric current control word bits based on the second control word, wherein the thermometric current control word bits are used to control switching of the second set of current sources after attainment of the frequency lock.

10. The DPLL of claim 9, wherein the PFD operates at the positive edge of the reference signal.

11. The DPLL of claim 9, wherein the digital filter operates at the negative edge of the reference signal.

12. The DPLL of claim 9, wherein the output signal generated by the CCO is an oscillating signal.

13. The DPLL of claim 9, further comprising a frequency lock detector, connected to the PFD and the binary and thermometric controllers, for detecting the frequency lock and indicating said frequency lock to the binary and thermometric controllers.

14. The DPLL of claim 9, wherein current sources of the first set of current sources are binary weighted.

15. The DPLL of claim 9, wherein current sources of the second set of current sources are thermometrically weighted.

16. The DPLL of claim 9, wherein the binary and thermometric controllers are digital to analog current sources.

17. The DPLL of claim 16, wherein currents generated by the binary and thermometric controllers have substantially the same unit step so that the frequency lock and a phase lock loop have substantially the same loop dynamics.

18. A digital phase lock loop (DPLL) that receives a reference signal generated by an external source and generates an oscillating output signal, the DPLL comprising:
   a current controlled oscillator (CCO), connected to first and second sets of current sources that generate currents received by the CCO, wherein the CCO generates the oscillating output signal based on a magnitude of the currents generated by the first and second sets of current sources;
   a loop divider, connected to the CCO, that receives the output signal and reduces a frequency thereof by a predetermined factor to generate a feedback signal;
   a phase-frequency detector (PFD), connected to the loop divider, that receives and compares the reference signal and the feedback signal and generates an error signal;
   a time-to-digital converter (TDC), connected to the PFD, that converts the error signal to a digital error signal;
   a digital filter, connected to the TDC, that generates first and second control words based on the digital error signal, wherein the first and second control words have at least one bit;
   a binary to thermometric converter, connected to the digital filter, that thermometrically codes the second control word;
   a frequency lock detector, connected to the PFD, for detecting a frequency lock in which the frequency of the reference signal is equal to the frequency of the feedback signal;
   a binary controller, connected to the digital filter and the first set of current sources, for generating binary current control word bits based on the first control word, wherein the binary current control word bits are used to control switching of the first set of current sources before achieving a frequency lock, wherein the frequency lock represents a condition in which the frequency of the reference signal is equal to the frequency of the feedback signal; and
   a thermometric controller, connected to the second set of current sources and the binary to thermometric converter, for generating thermometric current control word bits based on the second control word, wherein the thermometric current control word bits are used to control switching of the second set of current sources after achieving the frequency lock.

19. The DPLL of claim 18, wherein current sources of the first set of current sources are binary weighted.

20. The DPLL of claim 19, wherein current sources of the second set of current sources are thermometrically weighted.

* * * * *